US007716621B1

United States Patent
Li et al.

(10) Patent No.: US 7,716,621 B1
(45) Date of Patent: May 11, 2010

(54) METHOD AND SYSTEM FOR IMPROVING SIGNAL INTEGRITY IN INTEGRATED CIRCUIT DESIGNS

(75) Inventors: Ying-Meng Li, San Jose, CA (US); Chih-Wei Chang, Fremont, CA (US); Louis Chao, Fremont, CA (US); So Zen Yao, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 208 days.

(21) Appl. No.: 11/129,766

(22) Filed: May 13, 2005

Related U.S. Application Data

(60) Provisional application No. 60/570,976, filed on May 14, 2004.

(51) Int. Cl.
*G06F 17/50* (2006.01)

(52) U.S. Cl. .................. 716/14; 716/2; 716/5; 716/12; 716/13

(58) Field of Classification Search .................. 716/2, 716/12–15, 1, 5, 6
See application file for complete search history.

(56) References Cited

U.S. PATENT DOCUMENTS

| 6,415,426 | B1 * | 7/2002 | Chang et al. .................. 716/9 |
| 6,557,145 | B2 * | 4/2003 | Boyle et al. .................... 716/2 |
| 6,782,520 | B1 * | 8/2004 | Igusa et al. .................... 716/9 |
| 7,076,758 | B1 * | 7/2006 | Srinivasan et al. ............ 716/11 |
| 7,111,268 | B1 * | 9/2006 | Anderson et al. ............. 716/11 |
| 2001/0010090 | A1 * | 7/2001 | Boyle et al. ................... 716/2 |
| 2004/0243964 | A1 * | 12/2004 | McElvain et al. ............. 716/12 |
| 2005/0132309 | A1 * | 6/2005 | Saxena et al. .................. 716/4 |
| 2005/0138578 | A1 * | 6/2005 | Alpert et al. ................... 716/2 |

OTHER PUBLICATIONS

Bushroe, R.G. et al. "Chip Hierarchical Design System (CHDS): A Foundation for Timing-Driven Physical Design into the 21st Century" Proceedings of the International Symposium on Physical Design (ISPD '97), Napa Valley, CA, Apr. 14-16, 1997, pp. 212-217.
Ho, T.-Y. et al. "A Fast Crosstalk- and Performance-Driven Multi-level Routing System" Proceedings of the International Conference on Computer Aided Design (ICCAD '03), San Jose, CA, Nov. 11-13, 2003, pp. 382-387.
Khatri, S.P. et al. "Cross-Talk Immune VLSI Design Using a Network of PLAs Embedded in a Regular Layout Fabric" Proceedings of the IEEE/ACM International Conference on Computer-Aided Design (ICCAD '00), San Jose, CA, Nov. 5-9, 2000, pp. 412-418.

(Continued)

*Primary Examiner*—Vuthe Siek
(74) *Attorney, Agent, or Firm*—Vista IP Law Group LLP

(57) ABSTRACT

A method and system of improving signal integrity in integrated circuit designs is disclosed. In some embodiments, signal integrity optimization is conducted in conjunction with detailed routing of an integrated circuit design based upon a global routing plan previously generated for the design.

42 Claims, 8 Drawing Sheets

OTHER PUBLICATIONS

Liu, L.-C. E. et al. "Chip-Level Area Routing" Proceedings of the International Symposium on Physical Design (ISPD '98), Monterey, CA, Apr. 6-8, 1998, pp. 197-204.

Ravichandran, R. et al. "Physical Layout Automation for System-on-Packages" Proceedings of the 2004 Electronic Components and Technology Conference, Las Vegas, NV, May 2004, pp. 41-48.

Salek, A.H. et al. "A DSM Design Flow: Putting Floorplanning, Technology-Mapping, and Gate-Placement Together" Proceedings of the 35th Design Automation Conference (DAC 98), San Francisco, CA, Jun. 15-19, 1998, 6 pgs.

Stöhr, T. et al. "Analysis, Reduction and Avoidance of Crosstalk on VLSI Chips" Proceedings of the International Symposium on Physical Design (ISPD '98), Monterey, CA, Apr. 6-8, 1998, pp. 211-218.

Zhang, T. et al. "Simultaneous Shield and Buffer Insertion for Crosstalk Noise Reduction in Global Routing" Proceedings of the IEEE International Conference on Computer Design (ICCD '04), Oct. 11-13, 2004, pp. 93-98.

Zhou, H. et al. "Global Routing with Crosstalk Constraints" Proceedings of the 35th Design Automation Conference (DAC 98), San Francisco, CA, Jun. 15-19, 1998, pp. 374-377.

* cited by examiner

METHOD AND SYSTEM FOR IMPROVING SIGNAL INTEGRITY IN INTEGRATED CIRCUIT DESIGNS

CROSS-REFERENCE TO RELATED APPLICATION

The present application claims the benefit of U.S. Provisional Application No. 60/570,976, filed on May 14, 2004, which is hereby incorporated by reference in its entirety for all purposes as if fully set forth herein.

BACKGROUND AND SUMMARY

The present invention is related to integrated circuit designs. More particularly, the present invention is directed to a method and system for improving signal integrity in integrated circuit designs.

Signal integrity (SI) represents issues relating to the sources of noise in an integrated circuit (IC) design and their effect on performance. It has become increasingly important in recent years because advancements in IC design have led to a rise in noise level as well as a decline in immunity to the noise. For example, smaller process technologies result in greater interconnect densities, which in turn causes capacitive coupling, a growing source of noise. Additionally, designs with higher clock speeds and lower threshold voltages have an increased sensitivity to noise. Noise can affect a signal by destroying the logical information within, which could lead to functional failure, or by changing the timing of a transition, which could cause timing problems.

Traditionally, the design process for an IC begins with a set of design requirements, e.g., size, speed, purpose, etc. From these requirements, components (also known as cells or blocks) are created from scratch and/or selected from libraries of existing components. These components are then placed in such a way as to minimize the size of the chip. Routing then connects various terminals (also known as ports) of these cells in a manner that would satisfy the design requirements. The connection between ports with the same ID is called a net.

Previously, SI effects were either ignored altogether or analyzed and repaired after routing was complete. However, because the number of potential violations and their likelihood of seriously impacting the design have increased dramatically, the post-routing approach no longer works well by itself. In addition, pre-routing SI analysis is limited due to difficulties in predicting the timing variations that capacitive coupling between wires could introduce. Moreover, handling signal integrity issues exclusive of other concerns, such as timing and manufacturability, is simply not viable for today's designs as a fix for one problem will likely exacerbate another problem. Accordingly, there is a need for a method and system that can address these issues concurrently.

Embodiments of the present invention provide methods, systems, and mediums for improving signal integrity in integrated circuit designs. In one embodiment, a global routing plan is generated for an integrated circuit design. Signal integrity optimization is then conducted in conjunction with detailed routing based upon the global routing plan.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The accompanying drawings are included to provide a further understanding of the invention and, together with the Detailed Description, serve to explain the principles of the invention.

DETAILED DESCRIPTION

Improvement of signal integrity (SI) in integrated circuit (IC) designs is disclosed. Rather than attempt to predict potential SI problems prior to routing, which is essentially futile as wires in new IC designs account for a majority of the delay, or try to correct SI issues after routing, which can easily interrupt and prolong the design schedule, signal integrity optimization is conducted in conjunction with detailed routing of an integrated circuit design. This ensures that design closures are achieved rapidly and on-time without compromising product performance or manufacturing yield.

Figure 1:
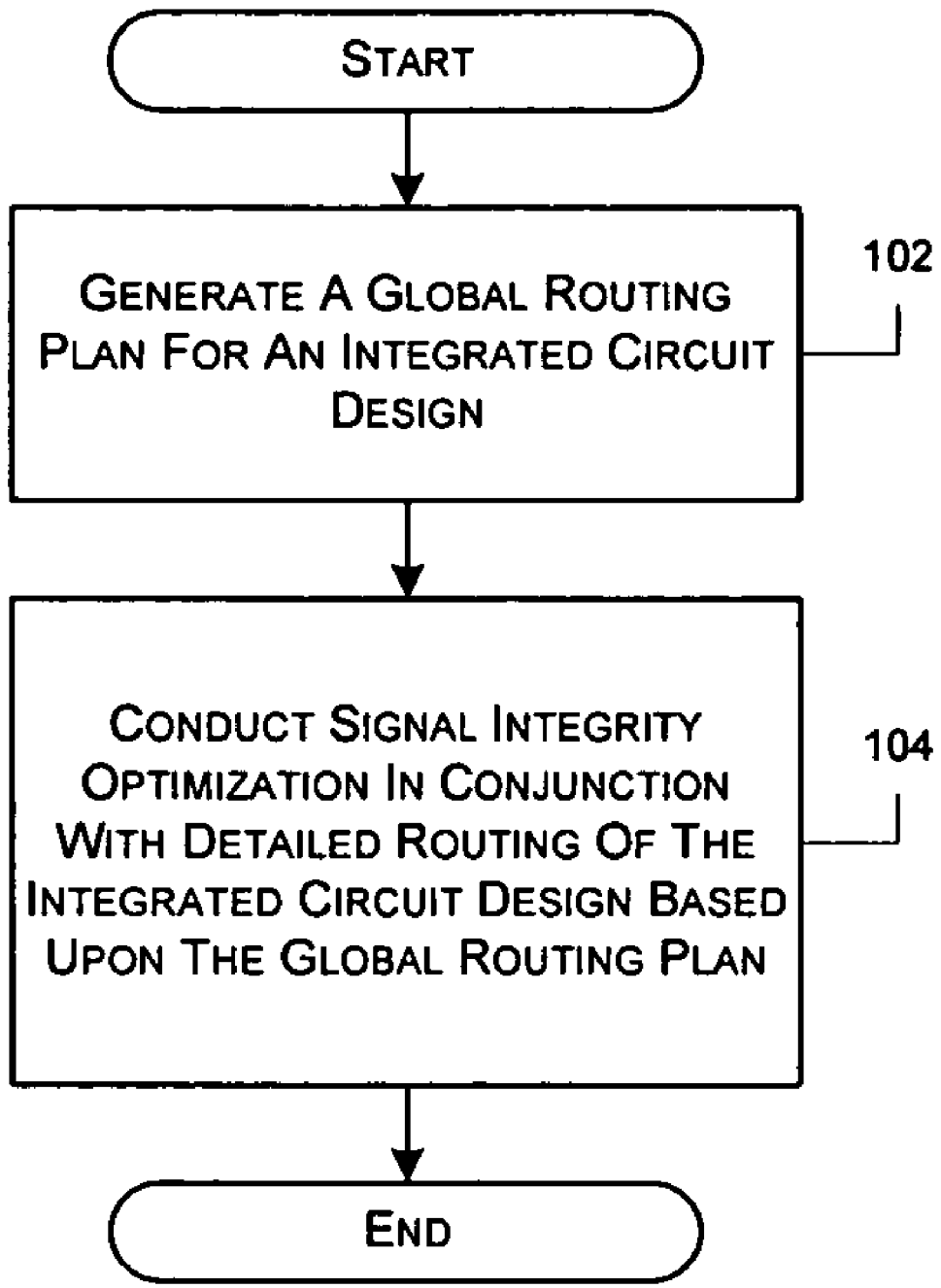
FIG. 1 is a flow chart of a method of improving signal integrity in integrated circuit designs according to an embodiment of the invention.

FIG. 1 illustrates a method of improving signal integrity in integrated circuit designs. A global routing plan is first generated for an integrated circuit design (102). In one embodiment, the integrated circuit design is a nanometer design, i.e., 130 nm or below. Signal integrity optimization is then conducted in conjunction with detailed routing of the integrated circuit design based upon the global routing plan (104). The global routing plan is a rough draft of how components in the design are connected. Detailed routing then fine tunes the connections by specifying the exact path each connection will take. Unlike the global routing plan, a detailed routing plan has to satisfy design rules, such as minimum wire spacing requirements.

Figure 2:
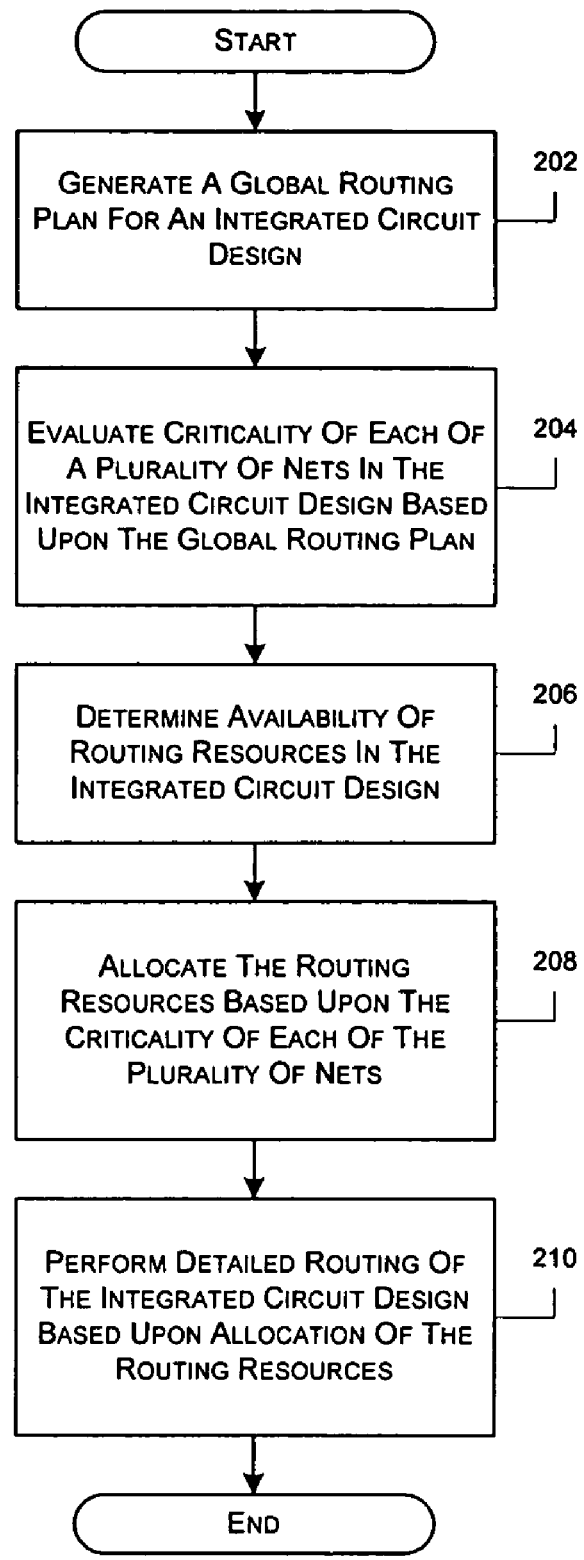
FIG. 2 illustrates a process flow of a method for improving signal integrity in integrated circuit designs according to another embodiment of the invention.

A flowchart of another method of improving signal integrity in integrated circuit designs is shown in FIG. 2. At 202, a global routing plan is generated for an integrated circuit design. Criticality of each of a plurality of nets in the integrated circuit design is then evaluated based upon the global routing plan (204). Criticality of a net relates to how critical the net is to the overall performance of the integrated circuit.

In an embodiment of the invention, the criticality of a net 'n' is calculated using the equation:

$$\text{Criticality}(n) = \text{Sensitivity}(n) / [\text{Slack}(n) - \text{WNS} + 1]. \quad (1)$$

The sensitivity of a net relates to how sensitive the net is to noises, such as crosstalk. Crosstalk occurs when the signal on an "aggressor" net interferes with the signal on a "victim" net and causes, for example, a signal glitch (i.e., malfunction) or a signal speed up or slow down (i.e., a timing error).

Figure 3A:
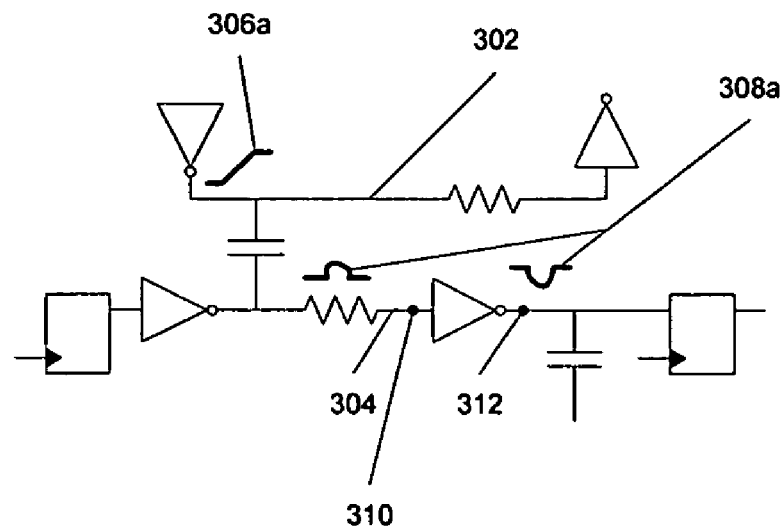
FIGS. 3a-3b depict examples of signal integrity issues that could arise.
Figure 3B:
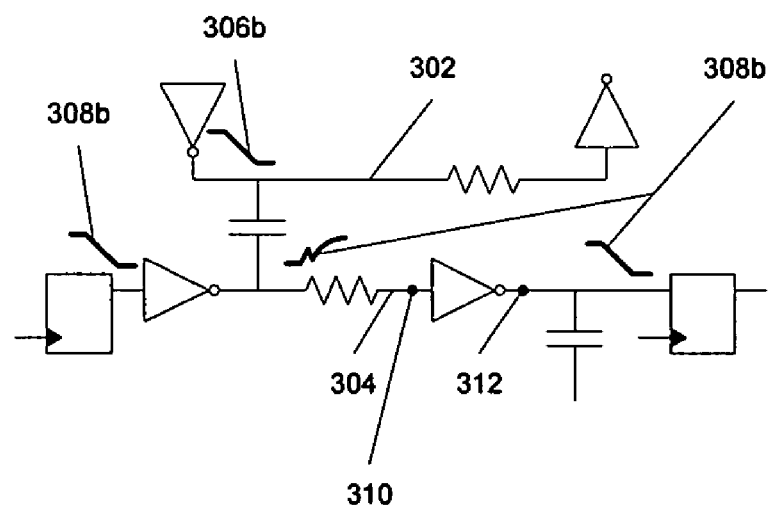

Depicted in FIGS. 3a-3b are examples of how crosstalk can cause problems in IC designs. In the examples, a signal 306 on a net 302 is attacking a signal 308 on an adjacent net 304. FIG. 3*a* shows how the interference or crosstalk from net 302 triggers a functional error on net 304 by flipping a flip-flop. FIG. 3*b* illustrates how crosstalk from net 302 induces a timing error on net 304 by causing a setup or hold violation. Crosstalk can be prevented by introducing extra spacing between a "victim" net and an "aggressor" net.

According to one embodiment of the invention, sensitivity of a net 'n' is calculated using to the equation:

$$\text{Sensitivity}(n) = (D1 - D2)/(C1 - C2). \quad (2)$$

D1 represents the delay from a first node of a net to a second node of the net without extra spacing and D2 represents the delay from the first node of the net to the second node of the net with extra spacing. For example, to figure out the delay on net 304 in FIG. 3, D1 could represent the delay from node 310 to node 312 as depicted, i.e., with net 302 immediately adjacent to net 304, and D2 could represent the delay from node 310 to node 312 with extra spacing between nets 302 and 304, e.g., if net 304 was moved such that it was no longer immediately adjacent to net 302. In other embodiments, a node may be a terminal or port of a net.

C1 represents the total capacitance of a net without extra spacing and C2 represents the total capacitance of the net with extra spacing. Total capacitance of a net equals the sum of the net's own capacitance and its coupling capacitance with neighboring nets, which changes as the distance to neighboring nets increases or decreases. For instance, in FIGS. 3*a*-3*b*, net 304's total capacitance is equal to its own capacitance and its coupling capacitance with net 302.

The slack of a net is the worst slack on all paths involving the net. In some embodiments of the invention, the slack of a net 'n' is calculated using the equation:

$$\text{Slack}(n) = \text{RAT} - AT. \quad (3)$$

RAT represents the required arrival time of a signal from the start of a path to the end of the path. AT represents the actual arrival time of the signal along the same path. Slack is the difference between the two. Slack is calculated at the end of the path and then annotated to each net on the path. The slack on a net is the worst slack of all paths going through the net.

The last variable in the criticality equation (1) above is WNS. WNS represents the worst negative slack measured in the integrated circuit design. In other words, WNS is equal to the slack of the path in the IC design with the smallest slack. Once the criticality of each of the nets in the integrated circuit design is known, the availability of routing resources in the integrated circuit design is determined (206). Routing resources are then allocated based upon the criticality of each of the plurality of nets (208) and detailed routing of the integrated circuit design is performed based upon allocation of the routing resources (210).

Figure 4:
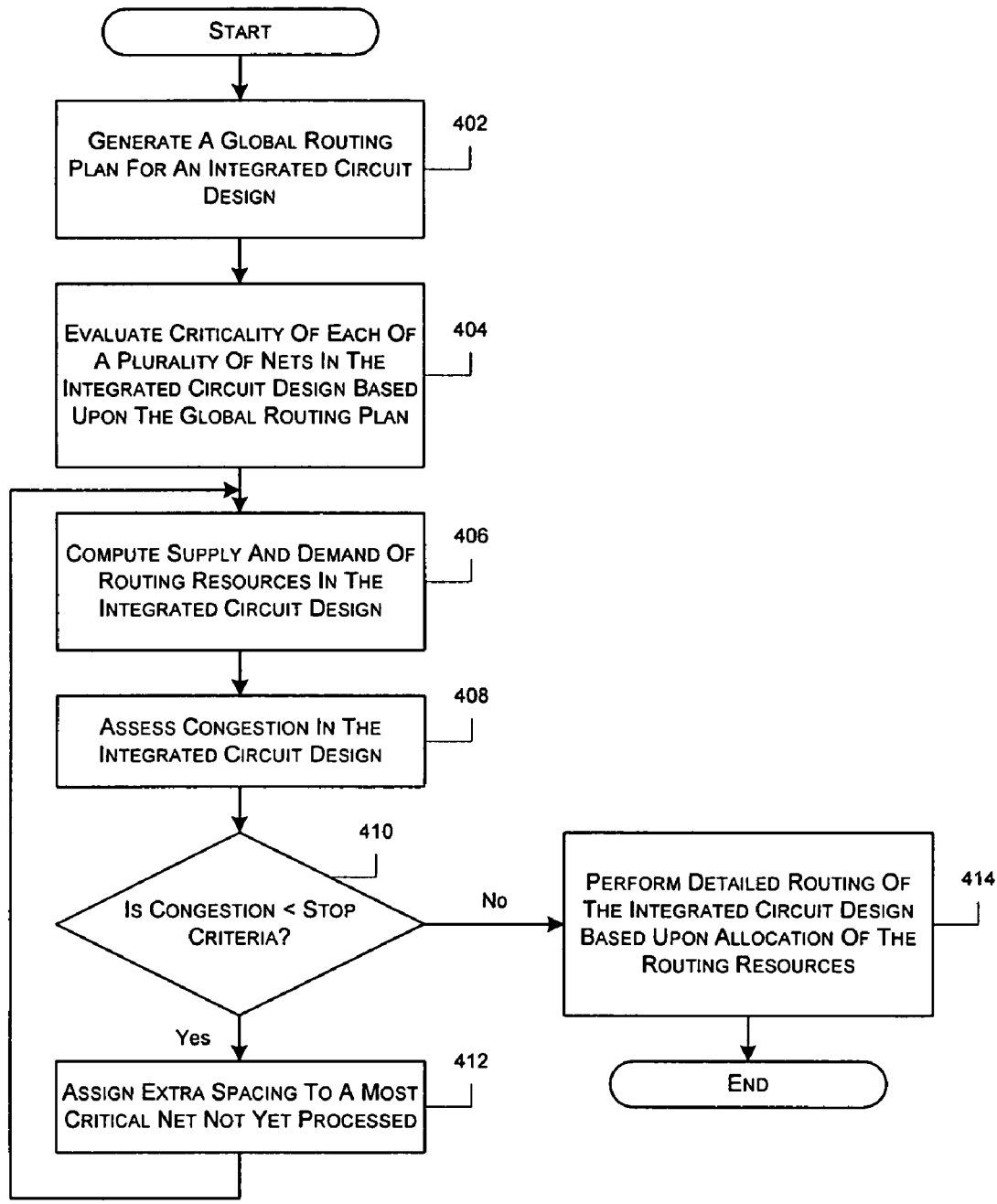
FIG. 4 shows a further embodiment of a method of improving signal integrity in integrated circuit designs.

Illustrated in FIG. 4 is a process flow of a method of improving signal integrity in integrated circuit designs according to a further embodiment of the invention. At 402, a global routing plan is generated for an integrated circuit design. Criticality of each of a plurality of nets in the integrated circuit design is then evaluated based upon the global routing plan (404). As previously discussed with respect to FIG. 2, the criticality of a net can be calculated using equations (1), (2), and (3) above.

Figure 5A:
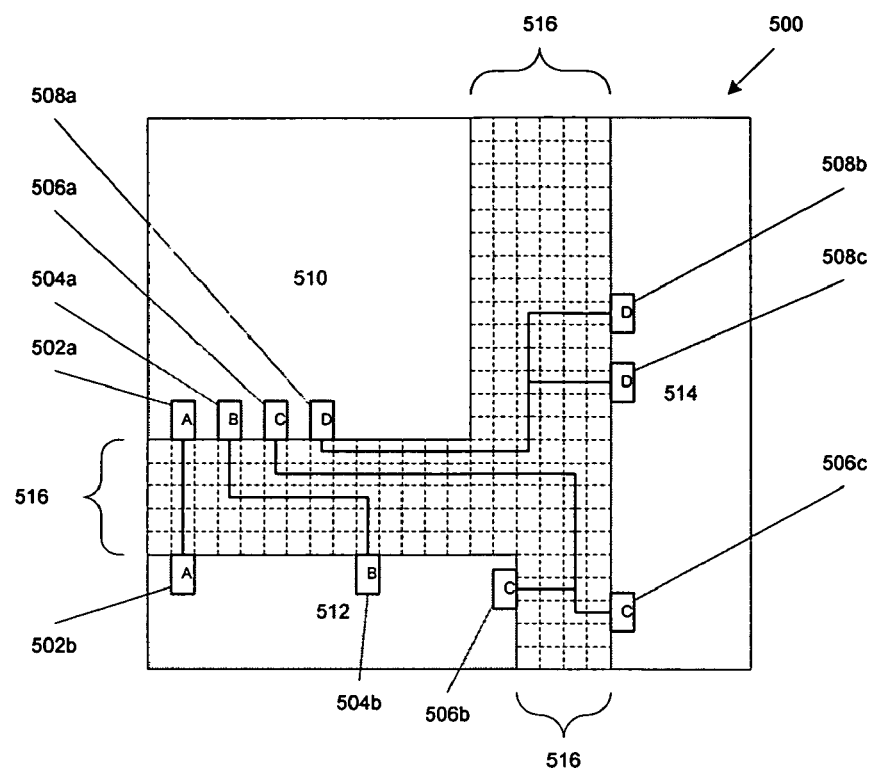
FIGS. 5a-5b illustrate a 2-dimension view of an integrated circuit design.
Figure 5B:
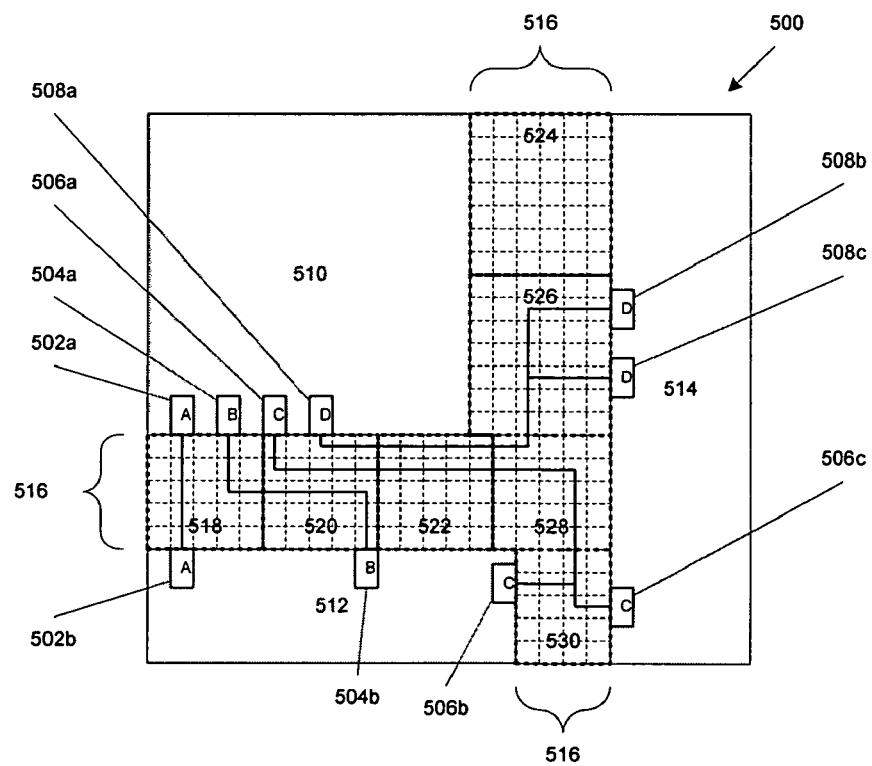

Following evaluation of the criticality of each of the plurality of nets, supply and demand of routing resources in the integrated circuit design are computed (406). Supply of routing resources in an integrated circuit design refers to regions in the design that are available for routing. For instance, FIGS. 5*a*-5*b* shows a 2-dimensional view of an integrated circuit design 500 with an area 516 in between components 510, 512, and 514 that is available for routing. The dashed lines within area 516 represents the various tracks or paths in which a net can be routed. Although not shown in the figures, an integrated circuit design comprise multiple layers and can therefore have multiple levels of routing tracks in the X-Y plane as well as routing tracks between the multiple levels in the Z-plane.

In one embodiment, the supply of routing resources in an integrated circuit design is calculated using the equation:

$$\text{Supply} = T. \quad (4)$$

T represents the total length of a plurality of routing tracks in the integrated circuit design. In FIGS. 5*a*-5*b*, for example, there are 5 tracks between cells 510 and 512, 4 tracks between cells 512 and 514, and 6 tracks between cells 510 and 514. Thus, the T for integrated circuit design 500 would be the sum of the lengths of all of the tracks in area 516. In other embodiments, T may represent the total area of the plurality of routing tracks in the design, rather than simply the length of the tracks.

Demand of routing resources in an integrated circuit design refers not only to the amount of space required to route a plurality of nets in the design, but also any extra spacing one or more nets may need. In an embodiment of the invention, the demand of routing resources in an integrated circuit design, is calculated using the equation:

$$\text{Demand} = \Sigma[L(n) + X(n)] \text{ for all nets}. \quad (5)$$

L(n) represents the length of a net. For instance, in FIGS. 5*a*-5*b*, four nets A, B, C, and D are illustrated. Net A connects terminal 502*a* in cell 510 and terminal 502*b* in cell 512. Net B connects terminal 504*a* in cell 510 and terminal 504*b* in cell 512. Net C connects terminal 506*a* in cell 510, terminal 506*b* in cell 512, and terminal 506*c* in cell 514. Net D connects terminal 508*a* in cell 510 and terminals 508*b* and 508*c* in cell 514. Hence, the L(n) of each net is equal to the length of the path connecting the terminals of the net. As with T, L(n) may also represent the area of a net, instead of just the length of the net.

X(n) represents the extra track length needed when a net is given extra spacing. The extra track length needed, however, changes depending upon a ratio TL/T, which is associated with the degree of congestion in an integrated circuit design. TL represents the total length of a plurality of nets in the integrated circuit design. In one embodiment, when TL/T≈1, the X(n) of a net is calculated using the equation:

$$X(n) = 2 * L(n). \quad (6)$$

In this situation, the degree of congestion in the integrated circuit design is quite high, and hence, only a few nets can have extra spacing. As a result, the extra spacing is unlikely to be shared between any neighboring nets.

In another embodiment, when TL/T≦0.5, the X(n) of a net is calculated using the equation:

$$X(n) = L(n). \quad (7)$$

Under these circumstances, X(n) is equal to L(n) because the integrated circuit design is relatively sparse. Therefore, extra spacing could be given to almost all of the nets. Since there is so much space available, each net will likely share the extra spacing with neighboring nets.

If the ratio of TL/T does not fall into the above categories, i.e., TL/T>0.5 and not ≈1, linear interpolation can be used to figure out an approximate X(n). This embodiment, the X(n) of a net is calculated using the equation:

$$X(n)=2*L(n)*(TL/T). \quad (8)$$

In other embodiments, another method, e.g., using multiple points, may be used to determine X(n) when the ratio of TL/T is greater than 0.5 and not almost equal to 1.

Once the supply and demand of routing resources in the integrated circuit design has been computed, congestion in the integrated circuit design is assessed (408). In one embodiment, the congestion in an integrated circuit design is calculated using the equation:

$$\text{Congestion}=\text{Demand}/\text{Supply}. \quad (9)$$

The demand and supply can be calculated using equations (4), (5), (6), (7), and (8), detailed above.

After congestion in the integrated circuit design has been assessed, a determination is made as to whether the congestion is below a stop criteria (410). The stop criteria is the maximum percentage of routing resources in the integrated circuit design that can be utilized. It may be user-defined and tuned depending upon the amount of signal integrity optimization desired. In some embodiments, the stop criteria is set at 95%.

When congestion is below the stop criteria, extra spacing is assigned to a most critical net not yet processed (412) and the process flow returns to action 406 to re-compute the supply and demand of routing resources in the integrated circuit design. If congestion was equal to or above the stop criteria, detailed routing of the integrated circuit design would be performed based upon allocation of the routing resources (414).

In one embodiment of the invention, signal integrity optimization and detailed routing is conducted on a window-by-window basis. For example, as shown in FIG. 5b, area 516 of integrated circuit design 500 can be divided into windows 518-530. Under these circumstances, action 104 in FIG. 1, actions 206-210 in FIG. 2, and actions 406-414 in FIG. 4 can be executed one window at a time. Thus, rather than determine the availability of routing resources for design 500 as a whole, availability of routing resources is determined on a window-by-window basis. As such, L(n) and X(n) of a net is limited to the part of the net that is within a particular window. In addition, TL is similarly limited to specific portions of nets routed through the particular window. Hence, in FIG. 5b, the demand in window 518 is much less than the demand in window 520.

Furthermore, the windows can be of various sizes and shapes, as seen in FIG. 5b. In this situation, the supply could differ from window to window. Therefore, T is dependent upon the number of routing tracks within a specific window. Although not shown in FIG. 5b, windows 518-530 may overlap in other embodiments. And since, as discussed above, integrated circuit designs may have multiple layers, windows may be 3-dimensional, encompassing multiple levels of routing tracks.

Conducting signal integrity optimization and detailed routing on a window-by-window basis conserves routing space as extra spacing need not be assigned to the whole length of a critical net. The net may pass through multiple windows and in certain windows, extra spacing may not be needed because the windows are relatively deserted and the net is sufficiently isolated from neighboring nets.

In some embodiments, signal integrity optimization and detailed routing are iterative. Under these circumstances, the size, shape, and/or position of the windows can change with each iteration. For instance, windows may increase in size with each iteration and continue to do so until one window completely covers all of the routing area.

Figure 6:
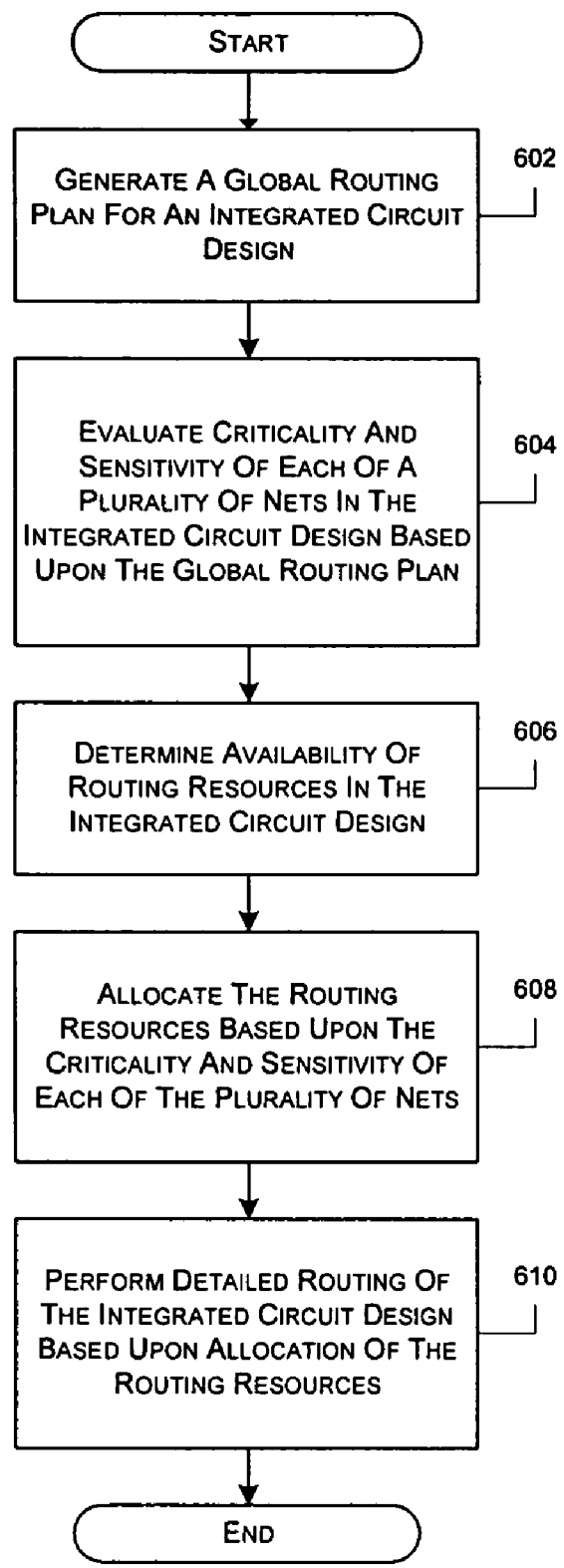
FIGS. 6-7 depict flowcharts of various methods for improving signal integrity in integrated circuit designs.
Figure 7:
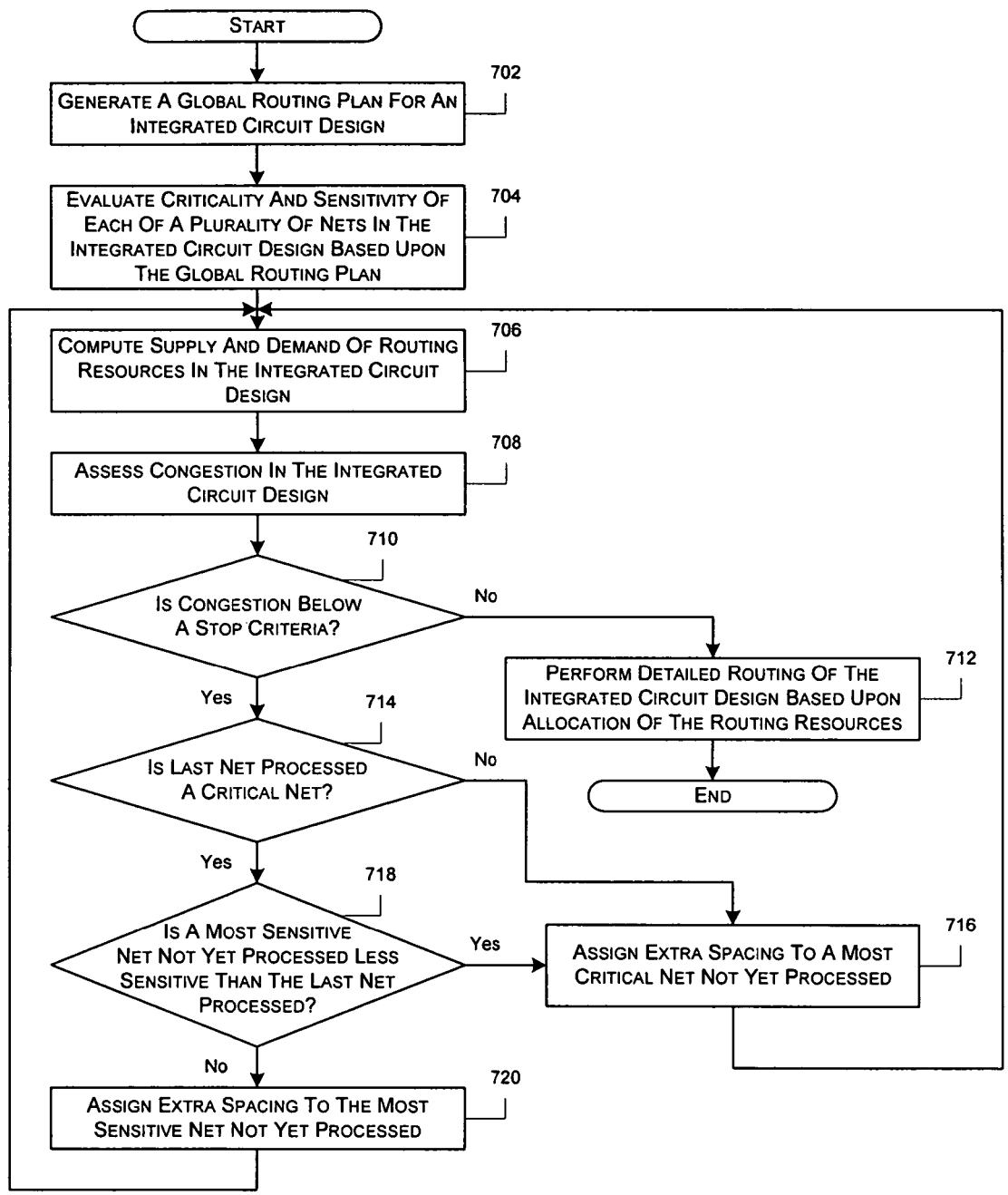

FIGS. 6-7 depict other methods of improving signal integrity in integrated circuit designs. In FIG. 6, a global routing plan is generated for an integrated circuit design (602). Criticality and sensitivity of each of a plurality of nets in the integrated circuit design are then evaluated based upon the global routing plan (604). As discussed with respect to FIG. 2, the criticality and sensitivity of a net can be calculated using equations (1), (2), and (3) above.

After the criticality and sensitivity of each of the plurality of nets have been evaluated, availability of routing resources in the integrated circuit design is determined (606) and routing resources are allocated based upon the criticality and sensitivity of each of the plurality of nets (608). Finally, detailed routing of the integrated circuit design is performed based upon allocation of the routing resources (610). Signal integrity optimization and detailed routing, as noted above, can be conducted iteratively and/or on a window-by-window basis. Thus, actions 606-610 in FIG. 6, like actions 206-210 in FIG. 2, can be executed one window at a time in multiple iterations.

In FIG. 7, a global routing plan is generated for an integrated circuit design at 702. At 704, criticality and sensitivity of each of a plurality of nets in the integrated circuit design are evaluated based upon the global routing plan. In certain embodiments, the criticality and sensitivity of a net are calculated according to equations (1), (2), and (3), discussed above in reference to FIG. 2.

Supply and demand of routing resources in the integrated circuit design are then computed (706) and congestion in the integrated circuit design is assessed (708). Congestion, supply, and demand, in some embodiments, is calculated according to equations (4), (5), (6), (7), (8), and (9), which are described above with respect to FIG. 4. At 710, a determination is made as to whether the congestion is below a stop criteria. As noted above, the stop criteria may be set at 0.95 or changed by a user depending upon the degree of SI optimization preferred.

If congestion is not below the stop criteria, detailed routing of the integrated circuit design is performed based upon allocation of the routing resources (712). However, if congestion is below the stop criteria, a determination is made at 714 as to whether the last net processed is a critical net. When the last net processed is not a critical net, extra spacing is assigned to a most critical net not yet processed (716).

When the last net processed is a critical net, a determination is made as to whether a most sensitive net not yet processed is less sensitive than the last net processed (718). If the last net processed is more sensitive than the most sensitive net not yet processed, then the process returns to action 716 and a most critical net not yet processed is assigned extra spacing. On the other hand, if the last net processed is as sensitive as or is less sensitive than the most sensitive net not yet processed, extra spacing is assigned to the most sensitive net not yet processed (720).

After extra spacing has been assigned to the most critical net not yet processed (716) or to the most sensitive net not yet processed (718), the process flow returns to action 706 to re-compute the supply and demand of routing resources in the integrated circuit design. In some embodiments, after the criticality and sensitivity of each net is known, a sensitivity array and a criticality array are created. The nets may be sorted in descending order from the most sensitive to the least sensitive and from the most critical to the least critical. Under such circumstances, the most critical net not yet processed is selected from the top of the criticality array and the most sensitive net not yet processed is selected from the top of the sensitivity array. Once a net has been processed from either array, it is removed from the other array.

Signal integrity optimization and detailed routing, as discussed above, can be conducted iteratively and/or on a window-by-window basis. As a result, actions 706-720 in FIG. 7, like actions 406-414 in FIG. 4, may be executed one window at a time in multiple iterations. By assigning extra spacing to the most sensitive nets in conjunction with the most critical nets, the process not only protects against crosstalk induced delay, but it also minimizes crosstalk induced glitches since for every critical net protected, another net of the same sensitivity is likewise protected, even though it is not as critical to overall performance of the integrated circuit.

Because signal integrity is evaluated in conjunction with detailed routing, a higher degree of control over potential signal integrity problems can be achieved using fewer routing resources. Moreover, other issues, such as timing and manufacturability, are concurrently addressed with signal integrity and routability as extra spacing is allocated to the most critical nets, which not only minimizes DFM (Design For Manufacturing) effects, but also improves delay.

System Architecture Overview

Figure 8:
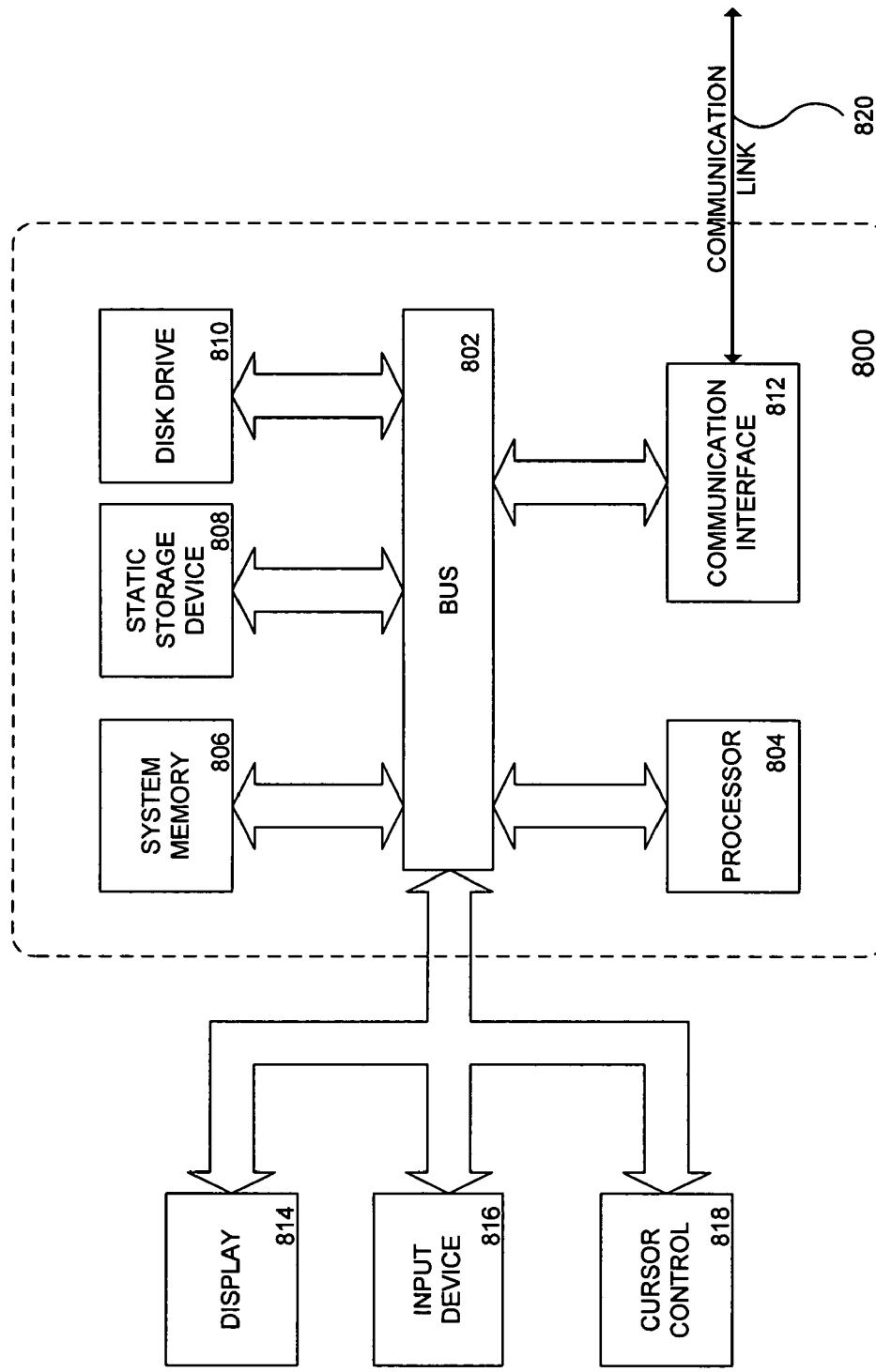
FIG. 8 is a diagram of a computer system with which embodiments of the present invention can be implemented.

FIG. 8 is a block diagram of a computer system 800 suitable for implementing an embodiment of the present invention. Computer system 800 includes a bus 802 or other communication mechanism for communicating information, which interconnects subsystems and devices, such as processor 804, system memory 806 (e.g., RAM), static storage device 808 (e.g., ROM), disk drive 810 (e.g., magnetic or optical), communication interface 812 (e.g., modem or ethernet card), display 814 (e.g., CRT or LCD), input device 816 (e.g., keyboard), and cursor control 818 (e.g., mouse or trackball).

According to one embodiment of the invention, computer system 800 performs specific operations by processor 804 executing one or more sequences of one or more instructions contained in system memory 806. Such instructions may be read into system memory 806 from another computer readable medium, such as static storage device 808 or disk drive 810. In alternative embodiments, hard-wired circuitry may be used in place of or in combination with software instructions to implement the invention.

The term "computer readable medium" as used herein refers to any medium that participates in providing instructions to processor 804 for execution. Such a medium may take many forms, including but not limited to, non-volatile media, volatile media, and transmission media. Non-volatile media includes, for example, optical or magnetic disks, such as disk drive 810. Volatile media includes dynamic memory, such as system memory 806. Transmission media includes coaxial cables, copper wire, and fiber optics, including wires that comprise bus 802. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 800. According to other embodiments of the invention, two or more computer systems 800 coupled by communication link 820 (e.g., LAN, PTSN, or wireless network) may perform the sequence of instructions required to practice the invention in coordination with one another.

Computer system 800 may transmit and receive messages, data, and instructions, including program, i.e., application code, through communication link 820 and communication interface 812. Received program code may be executed by processor 804 as it is received, and/or stored in disk drive 810, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method of improving signal integrity in integrated circuit designs, the method comprising:

generating a global routing plan for an integrated circuit design;

conducting, by using a processor, signal integrity optimization in conjunction with detailed routing of the integrated circuit design based at least in part upon the global routing plan, wherein the detailed routing is performed on spacing made available for routing, the spacing for routing is allocated based at least in part upon a priority for the detailed routing determined at least in part by an amount of the signal integrity optimization desired; and storing the priority on a volatile or non-volatile computer readable medium or displaying the priority on a display device.

2. The method of claim 1, wherein conducting signal integrity optimization in conjunction with detailed routing of the integrated circuit design based upon the global routing plan comprises:

(a) evaluating criticality of each of a plurality of nets in the integrated circuit design based upon the global routing plan;

(b) determining availability of routing resources in the integrated circuit design;

(c) allocating the routing resources based upon the criticality of each of the plurality of nets; and (d) performing detailed routing of the integrated circuit design based upon allocation of the routing resources.

3. The method of claim 2, wherein the criticality of each of the plurality of nets is calculated according to the equation:

$$\text{Criticality}(n) = \text{Sensitivity}(n)/[\text{Slack}(n) - \text{WNS} + 1],$$

where WNS denotes the worst negative slack permitted in the integrated circuit design.

4. The method of claim 3, wherein the sensitivity of each of the plurality of nets is calculated according to the equation:

$$\text{Sensitivity}(n) = (D1 - D2)/(C1 - C2),$$

where D1 denotes the delay from a first node of a net to a second node of the net without extra spacing, D2 denotes the delay from the first node of the net to the second node of the net with extra spacing, C1 denotes the total capacitance of the net without extra spacing, and C2 denotes the total capacitance of the net with extra spacing.

5. The method of claim 3, wherein the slack of each of the plurality of nets is calculated according to the equation:

$$Slack(n)=RAT-AT,$$

where RAT denotes the required arrival time of a signal from a first terminal of a net to a second terminal of the net and AT denotes the actual arrival time of the signal from the first terminal of the net to the second terminal of the net.

6. The method of claim 2, wherein determining availability of routing resources in the integrated circuit design comprises:
computing supply and demand of routing resources in the integrated circuit design; and
assessing congestion in the integrated circuit design.

7. The method of claim 6, wherein congestion is calculated according to the equation:

$$Congestion=Demand/Supply.$$

8. The method of claim 6, wherein supply of routing resources is calculated according to the equation:

$$Supply=T,$$

where T denotes the total length of a plurality of routing tracks in the integrated circuit design.

9. The method of claim 6, wherein the demand of routing resources is calculated according to the equation:

$$Demand=\Sigma[L(n)+X(n)] \text{ for all nets,}$$

where L(n) denotes the length of a net and X(n) denotes the extra track length needed when the net is given extra spacing.

10. The method of claim 9, wherein X(n) changes depending upon a ratio TL/T, where TL denotes the total length of the plurality of nets and T denotes the total length of a plurality of routing tracks in the integrated circuit design.

11. The method of claim 10, wherein when the ratio TL/T≈1, X(n) is calculated according to the equation:

$$X(n)=2*L(n).$$

12. The method of claim 10, wherein when the ratio TL/T≦0.5, X(n) is calculated according to the equation:

$$X(n)=L(n).$$

13. The method of claim 10, wherein when the ratio TL/L>0.5 and not ≈1, X(n) is calculated according to the equation:

$$X(n)=2*L(n)*(TL/L).$$

14. The method of claim 6, wherein allocating the routing resources based upon the criticality of each of the plurality of nets comprises:
assigning extra spacing to a most critical net not yet processed.

15. The method of claim 14, wherein extra spacing is assigned only when congestion is below a stop criteria.

16. The method of claim 15, wherein the stop criteria is 95%.

17. The method of claim 15, wherein the stop criteria is adjustable.

18. The method of claim 1, wherein signal integrity optimization and detailed routing are conducted on a window-by-window basis.

19. The method of claim 18, wherein signal integrity optimization and detailed routing are iterative.

20. The method of claim 19, wherein the size, shape, and/or position of each window changes with each iteration.

21. The method of claim 1, wherein conducting signal integrity optimization in conjunction with detailed routing of the integrated circuit design based upon the global routing plan comprises:
(a) evaluating criticality and sensitivity of each of a plurality of nets in the integrated circuit design based upon the global routing plan;
(b) determining availability of routing resources in the integrated circuit design;
(c) allocating the routing resources based upon the criticality and sensitivity of each of the plurality of nets; and
(d) performing detailed routing of the integrated circuit design based upon allocation of the routing resources.

22. The method of claim 21, wherein the criticality of each of the plurality of nets is calculated according to the equation:

$$Criticality(n)=Sensitivity(n)/[Slack(n)-WNS+1],$$

where WNS denotes the worst negative slack permitted in the integrated circuit design.

23. The method of claim 22, wherein the slack of each of the plurality of nets is calculated according to the equation:

$$Slack(n)=RAT-AT,$$

where RAT denotes the required arrival time of a signal from a first terminal of a net to a second terminal of the net and AT denotes the actual arrival time of the signal from the first terminal of the net to the second terminal of the net.

24. The method of claim 21, wherein the sensitivity of each of the plurality of nets is calculated according to the equation:

$$Sensitivity(n)=(D1-D2)/(C1-C2),$$

where D1 denotes the delay from a first node of a net to a second node of the net without extra spacing, D2 denotes the delay from the first node of the net to the second node of the net with extra spacing, C1 denotes the total capacitance of the net without extra spacing, and C2 denotes the total capacitance of the net with extra spacing.

25. The method of claim 21, wherein determining availability of routing resources in the integrated circuit design comprises:
computing supply and demand of routing resources in the integrated circuit design; and
assessing congestion in the integrated circuit design.

26. The method of claim 25, wherein congestion is calculated according to the equation:

$$Congestion=Demand/Supply.$$

27. The method of claim 25, wherein supply of routing resources is calculated according to the equation:

$$Supply=T,$$

where T denotes the total length of a plurality of routing tracks in the integrated circuit design.

28. The method of claim 25, wherein the demand of routing resources is calculated according to the equation:

$$Demand=\Sigma[L(n)+X(n)] \text{ for all nets,}$$

where L(n) denotes the length of a net and X(n) denotes the extra track length needed when the net is given extra spacing.

29. The method of claim 28, wherein X(n) changes depending upon a ratio TL/T, where TL denotes the total length of the plurality of nets and T denotes the total length of a plurality of routing tracks in the integrated circuit design.

30. The method of claim 29, wherein when the ratio TL/T≈1, X(n) is calculated according to the equation:

$$X(n)=2*L(n).$$

31. The method of claim 29, wherein when the ratio TL/T≦0.5, X(n) is calculated according to the equation:

$$X(n)=L(n).$$

32. The method of claim 29, wherein when the ratio TL/L>0.5 and not ≈1, X(n) is calculated according to the equation:

$$X(n)=2*L(n)*(TL/L).$$

33. The method of claim 25, wherein allocating the routing resources based upon the criticality and sensitivity of each of the plurality of nets comprises:
   assigning extra spacing to a most critical net not yet processed when a last net processed is a sensitive net or when the last net processed is more sensitive than a most sensitive net not yet processed; and
   assigning extra spacing to the most sensitive net not yet processed when the last net processed is a critical net and when the last net processed is as sensitive as or less sensitive than the most sensitive net not yet processed.

34. The method of claim 33, wherein extra spacing is assigned only when congestion is below a stop criteria.

35. The method of claim 34, wherein the stop criteria is 95%.

36. The method of claim 34, wherein the stop criteria is adjustable.

37. A computer program product that includes a volatile or non-volatile computer readable storage medium, the volatile or non-volatile computer readable storage medium comprising instructions which, when executed by a processor, causes the processor to execute a process for improving signal integrity in integrated circuit designs, the process comprising:
   generating a global routing plan for an integrated circuit design;
   conducting signal integrity optimization in conjunction with detailed routing of the integrated circuit design based at least in part upon the global routing plan, wherein the detailed routing is performed on spacing made available for routing, the spacing for routing is allocated based at least in part upon a priority for the detailed routing determined at least in part by an amount of the signal integrity optimization desired; and
   storing the priority or displaying the priority on a display device.

38. The product of claim 37, wherein conducting signal integrity optimization in conjunction with detailed routing of the integrated circuit design based upon the global routing plan comprises:
   (a) evaluating criticality of each of a plurality of nets in the integrated circuit design based upon the global routing plan;
   (b) determining availability of routing resources in the integrated circuit design;
   (c) allocating the routing resources based upon the criticality of each of the plurality of nets; and
   (d) performing detailed routing of the integrated circuit design based upon allocation of the routing resources.

39. The product of claim 38, wherein the criticality of each of the plurality of nets is calculated according to the equation:

$$\text{Criticality}(n)=\text{Sensitivity}(n)/[\text{Slack}(n)-\text{WNS}+1],$$

where WNS denotes the worst negative slack permitted in the integrated circuit design.

40. A system for improving signal integrity in integrated circuit designs, the system comprising:
   means for generating a global routing plan for an integrated circuit design;
   a processor for conducting signal integrity optimization in conjunction with detailed routing of the integrated circuit design based at least in part upon the global routing plan, wherein the detailed routing is performed on spacing made available for routing, the spacing for routing is allocated based at least in part upon a priority for the detailed routing determined at least in part by an amount of the signal integrity optimization desired; and
   a volatile or non-volatile computer readable medium for storing the priority or a display device for displaying the priority.

41. The system of claim 40, wherein means for conducting signal integrity optimization in conjunction with detailed routing of the integrated circuit design based upon the global routing plan comprises:
   (a) means for evaluating criticality of each of a plurality of nets in the integrated circuit design based upon the global routing plan;
   (b) means for determining availability of routing resources in the integrated circuit design;
   (c) means for allocating the routing resources based upon the criticality of each of the plurality of nets; and
   (d) means for performing detailed routing of the integrated circuit design based upon allocation of the routing resources.

42. The system of claim 41, wherein the criticality of each of the plurality of nets is calculated according to the equation:

$$\text{Criticality}(n)=\text{Sensitivity}(n)/[\text{Slack}(n)-\text{WNS}+1],$$

where WNS denotes the worst negative slack permitted in the integrated circuit design.

* * * * *